(12) United States Patent
Kim et al.

(10) Patent No.: US 9,851,401 B2
(45) Date of Patent: Dec. 26, 2017

(54) STACKED MEMORY DEVICE AND SEMICONDUCTOR MEMORY SYSTEM INCLUDING THE SAME

(71) Applicant: SK hynix Inc., Gyeonggi-do (KR)

(72) Inventors: Kyung-Whan Kim, Gyeonggi-do (KR); Jong-Chern Lee, Gyeonggi-do (KR); Young-Jae Choi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 64 days.

(21) Appl. No.: 15/147,244

(22) Filed: May 5, 2016

(65) Prior Publication Data
US 2017/0146598 A1    May 25, 2017

(30) Foreign Application Priority Data
Nov. 23, 2015   (KR) ........................ 10-2015-0163772

(51) Int. Cl.
*G01R 31/3187*   (2006.01)
*G01R 31/3181*   (2006.01)
*G11C 29/00*     (2006.01)

(52) U.S. Cl.
CPC ... *G01R 31/3187* (2013.01); *G01R 31/31813* (2013.01); *G11C 29/00* (2013.01)

(58) Field of Classification Search
CPC .............. G01R 31/26; G01R 31/2642; G01R 31/2648; G01R 31/2831; G01R 31/31702
See application file for complete search history.

(56) References Cited

U.S. PATENT DOCUMENTS

2014/0237310 A1* 8/2014 Cheng .............. G01R 31/31855
                                                         714/727
2016/0097810 A1* 4/2016 Kang ..................... G11C 29/40
                                                         714/736

FOREIGN PATENT DOCUMENTS

KR    1020140010632    1/2014
KR    1020140146355    12/2014

* cited by examiner

*Primary Examiner* — Tung X Nguyen
(74) *Attorney, Agent, or Firm* — IP & T Group LLP (57) ABSTRACT

Disclosed herein is a stacked memory device including a base die and a plurality of core dies stacked using a plurality of through-chip electrodes. Each of the core dies may include a plurality of input pads capable of receiving addresses externally in a wafer-level test mode; a control signal generation unit capable of decoding the addresses received through the input pads to generate a first control signal; an address generation unit capable of generating a first address based on the addresses received through the input pads; and a signal selection unit capable of selecting one of the first control signal and a second control signal received from the base die through a corresponding through-chip electrode to output a global control signal, and selecting one of the first address and a second address received from the base die through a corresponding through-chip electrode to output a global address.

19 Claims, 4 Drawing Sheets

STACKED MEMORY DEVICE AND SEMICONDUCTOR MEMORY SYSTEM INCLUDING THE SAME

CROSS-REFERENCE TO RELATED APPLICATION

The present application claims priority of Korean Patent Application No. 10-2015-0163772, filed on Nov. 23, 2015, which is incorporated herein by reference in its entirety.

BACKGROUND

1. Field

Exemplary embodiments of the present invention relate generally to a semiconductor design technology and, more particularly, to a stacked memory device capable of performing a wafer-level test and a semiconductor memory system including the same.

2. Description of the Related Art

As the semiconductor memory technology has developed rapidly, there is a growing need for a high degree of integration and high performance for a packaging technology for semiconductor integration devices. A two-dimensional (2D) structure, in which semiconductor chips having integration circuits are disposed on a printed circuit board (PCB) using wires or bumps, have been used in the past as conventional packaging technology. More recently, various three-dimensional (3D) structure technologies employing a plurality of semiconductor chips stacked on top of one another are being developed.

More specifically, a plurality of memory chips are typically vertically stacked in a stacked memory device having a 3D structure. Furthermore, the semiconductor chips which are stacked in a vertical direction are electrically coupled through one or more through-chip electrodes, for example, through-silicon vias (TSVs) and are mounted on a substrate for a semiconductor package.

Due to the increased complexity of a stacked memory device new methods are being developed for ensuring product quality requiring testing both at the wafer level as well as after assembly of the wafers into the packaged stacked structure has been completed. Hence, typically a method for testing a stacked memory device employing TSVs may include a package-level test method for testing the stacked memory device after it has been assembled into a packaged product and a wafer-level test method performed in a wafer state prior to the assembling process.

SUMMARY

Various embodiments of the present invention are directed to a stacked memory device capable of performing a wafer-level test. The stacked memory device may perform a wafer-level test in a plurality of core dies using signals that are equivalent to global control signals generated by a base die. The signals are generated by the core dies in the stacked memory device including the base die and the plurality of core dies. The signals are transmitted through a plurality of through-chip electrodes. Various embodiments are also directed to a wafer-level test method.

In an embodiment, a stacked memory device may include a base die and a plurality of core dies stacked using a plurality of through-chip electrodes. Each of the core dies includes a plurality of input pads capable of receiving addresses externally in a wafer-level test mode; a control signal generation unit capable of decoding the addresses received through the input pads to generate a first control signal; an address generation unit capable of generating a first address based on the addresses received through the input pads; and a signal selection unit capable of selecting one of the first control signal and a second control signal received from the base die through a corresponding through-chip electrode to output a global control signal, and selecting one of the first address and a second address received from the base die through a corresponding through-chip electrode to output a global address.

In an embodiment, a stacked memory device may include a base die and a plurality of core dies stacked using a plurality of through-chip electrodes. Each of the core dies includes a plurality of input pads capable of receiving column addresses and row addresses externally in a wafer-level test mode; an address latch unit capable of latching the row addresses and column addresses received through the input pads to output a row latch address and a column latch address; a row signal generation unit capable of decoding the row latch address to generate first row control signals, and generating a first row address based on the row latch address; a column signal generation unit capable of decoding the column latch address to generate first column control signals, and generating a first column address based on the column latch address; a row signal selection unit capable of selecting one of the first row control signal and a second row control signal received from the base die through a corresponding through-chip electrode based on a wafer-level test enable signal to output a global row control signal, and selecting one of the first row address and a second row address received from the base die through a corresponding through-chip electrode based on the wafer-level test enable signal to output a global row address; and a column signal selection unit capable of selecting one of the first column control signal and a second column control signal received from the base die through a corresponding through-chip electrode based on the wafer-level test enable signal to output a global column control signal, and selecting one of the first column address and a second column address received from the base die through a corresponding through-chip electrode based on the wafer-level test enable signal to output a global column address.

In an embodiment, a stacked memory device may include a base die and a plurality of core dies stacked using a plurality of through-chip electrodes. Each of the core dies includes a plurality of input pads capable of receiving addresses externally in a wafer-level test mode; an address latch unit capable of latching the addresses received through the input pads to output latch addresses; a decoder capable of decoding the latch addresses to generate a first command pulse signal; a first signal selection unit capable of selecting one of the first command pulse signal and a second command pulse signal received from the base die through a corresponding through-chip electrode based on a wafer-level test enable signal to output a source command pulse signal, and selecting one of the latch addresses and addresses received from the base die through corresponding through-chip electrodes based on the wafer-level test enable signal to output a source address; and a test mode signal generation unit capable of generating a plurality of test mode signals based on the source command pulse signal and the source address.

In an embodiment, a stacked memory device may include a base die and a plurality of core dies stacked using a plurality of through-chip electrodes. Each of the core dies includes a plurality of input pads capable of receiving addresses externally in a wafer-level test mode; an address latch unit capable of latching row addresses and column addresses received through the input pads to output a row latch address and a column latch address; a row signal generation unit capable of decoding the row latch address to generate a plurality of first row control signals, and generating a first row address based on the row latch address; a row signal selection unit capable of selecting one of the first row control signal and a second row control signal received from the base die through a corresponding through-chip electrode based on a wafer-level test enable signal to output a global row control signal, and selecting one of the first row address and a second row address received from the base die through a corresponding through-chip electrode based on the wafer-level test enable signal to output a global row address; a column decoder capable of decoding the column latch address to generate a first column command pulse signal and a second column command pulse signal for an internal operation of a corresponding core die; a first column signal selection unit capable of selecting one of the first column command pulse signal and a pulse signal received from the base die through a corresponding through-chip electrode based on the wafer-level test enable signal to output a source command pulse signal, and selecting one of the column latch address and an address received from the base die through a corresponding through-chip electrode based on the wafer-level test enable signal to output a source column address; a test mode signal generation unit capable of generating a plurality of test mode signals based on the source column command pulse signal and the source column address; a CAS signal generation unit capable of generating a first column control signal based on the second column command pulse signal; a column address generation unit capable of generating a first column address based on the column latch address; and a second column signal selection unit capable of selecting one of the first column control signal and a second column control signal received from the base die through a corresponding through-chip electrode based on the wafer-level test enable signal to output as a global column control signal, and selecting one of the first column address and a second column address received from the base die through a corresponding through-chip electrode based on the wafer-level test enable signal to output a global column address.

In the wafer-level test mode, the row signal selection unit may select the first row control signal and the first row address; the first column signal selection unit may select the first column command pulse signal and the first column latch address; and the second column signal selection unit may select the first column control signal and the first column address. The row signal generation unit comprises: a row decoder capable of decoding the row latch address to generate a row command pulse signal for an internal operation of the corresponding core die; a row control signal output unit capable of outputting the first row control signal based on the row command pulse signal; and a row address generation unit capable of generating the first row address based on the row latch address. The row control signal output unit may generate a plurality of bank active signals based on the row command pulse signal. The column control signal output may generate a CAS signal based on the second column command pulse.

In an embodiment, a semiconductor memory system may include an interposer; a controller die disposed on the interposer; and a base die and a plurality of core dies sequentially stacked on the interposer using a plurality of through-chip electrodes, wherein each of the core dies comprises: a plurality of input pads capable of receiving addresses externally in a wafer-level test mode; a control signal generation unit capable of decoding the addresses received through the input pads to generate a first control signal; an address generation unit capable of generating a first address based on the addresses received through the input pads; and a signal selection unit capable of selecting one of the first control signal and a second control signal received from the base die through a corresponding through-chip electrode to output a global control signal, and selecting one of the first address and a second address received from the base die through a corresponding through-chip electrode to output a global address.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned otherwise in a sentence.

A semiconductor memory system according to an embodiment of the present invention may be implemented in a form, such as a system-in-package (SIP), a multi-chip package (MCP), a system-on-chip (SoC), a package-on-package (PoP) including a plurality of packages, and the like.

Figure 1:
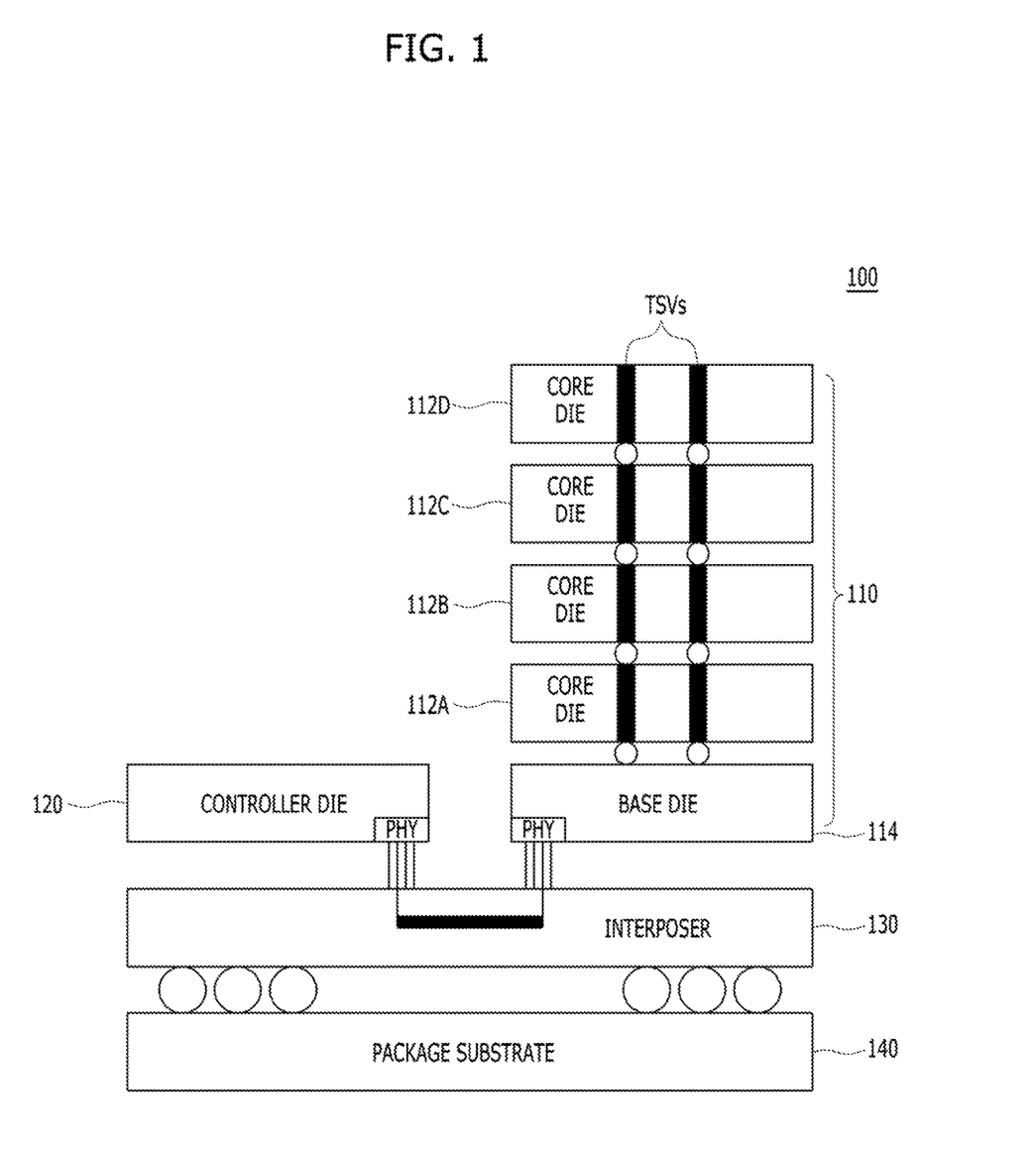
FIG. 1 is a diagram illustrating a semiconductor memory system according to an embodiment of the present invention.

Referring now to FIG. 1 a semiconductor memory system 100 is provided, according to an embodiment of the present invention.

The semiconductor memory system 100 may include a stacked memory device 110, a controller die 120 (also referred to as a controller), an interposer 130, and a package substrate 140.

The interposer 130 may be disposed on the package substrate 140.

The stacked memory device 110 and the controller die 120 may be disposed on the interposer 130.

Physical regions PHYs included in the stacked memory device 110 and the controller die 120 may be coupled to each other through the interposer 130.

Along with the controller 120, the interposer 130, and the package substrate 140, the stacked memory device 110 may form a high bandwidth memory (IBM). The stacked memory device 110 may include a plurality of dies (i.e., chips) that are stacked and electrically coupled through TSVs so that the number of input/output units is increased to improve the bandwidth.

The stacked memory device 110 may include a base die (i.e., a logic die) 114 and a plurality of core dies (i.e., DRAM dies) 112A to 112D. A first to fourth core dies 112A to 112D are illustrated in FIG. 1, as an example. The core dies 112A to 112D may be stacked over the base die 114 and may be coupled through the TSVs.

A plurality of memory cells for storing data and circuits for the core operations of the memory cells may be disposed in each of the core dies 112A to 112D. A circuit for an interface between the core dies 112A to 112D and the controller die 120 may be mounted on the base die 114. Accordingly, various functions within the semiconductor memory system, for example, memory management functions, such as power management of the memory cells, refresh operation of the memory cells, and timing control functions between the core dies 112A to 112D and the controller die 120 may be performed. The controller die 120 may be or comprise a central processing unit (CPU) die, a graphic process unit (GPU) die, a system on chip (SoC) die, and any combinations thereof.

Configuring such a semiconductor memory system may include, the following two methods which are described as examples of suitable methods.

According to the first method, the memory cells and necessary circuits (e.g., a sense amplifier and a row line driver) for the core operations of the memory cells, which need to be disposed adjacent to the memory cells are disposed in each of the core dies 112A to 112D. Circuits (e.g., a row decoder, a column decoder, and an address/command control circuit) for the input/output operations of the memory device also disposed in each of the core dies 112A to 112D. Only an interface circuit that performs signal buffering between the core dies 112A to 112D and the controller die 120 is disposed in the base die 114. In this case, a row address and a column address are provided from the base die 114 to the respective core dies 112A to 112D using the TSVs.

According to the second method, the memory cells and the necessary circuits are disposed in each of the core dies 112A to 112D, and most of circuits for the input/output operations of the memory device are disposed in the base die 114. In this case, a command processing circuit is disposed in the base die 114. A signal generated by the command processing circuit of the base die 114 is transmitted to the respective core dies 112A to 112D using the TSVs instead of providing a row address and a column address, thereby improving the degree of integration of the core dies 112A to 112D.

However, for the second method configuration, since most of address/command control circuits for controlling the memory device are disposed in the base die 114, it is difficult to perform a wafer-level test on each of the core dies 112A to 112D.

In an embodiment of the present invention, in order to support a wafer-level test performed on each core die in addition to a package-level test, the respective core dies 112A to 112D generate equivalent global control signals corresponding to global control signals generated by the base die 114. Then, either one of the global control signals or one of the equivalent global control signals is selected based on whether a package-level test or wafer-level test is performed.

Figure 2:
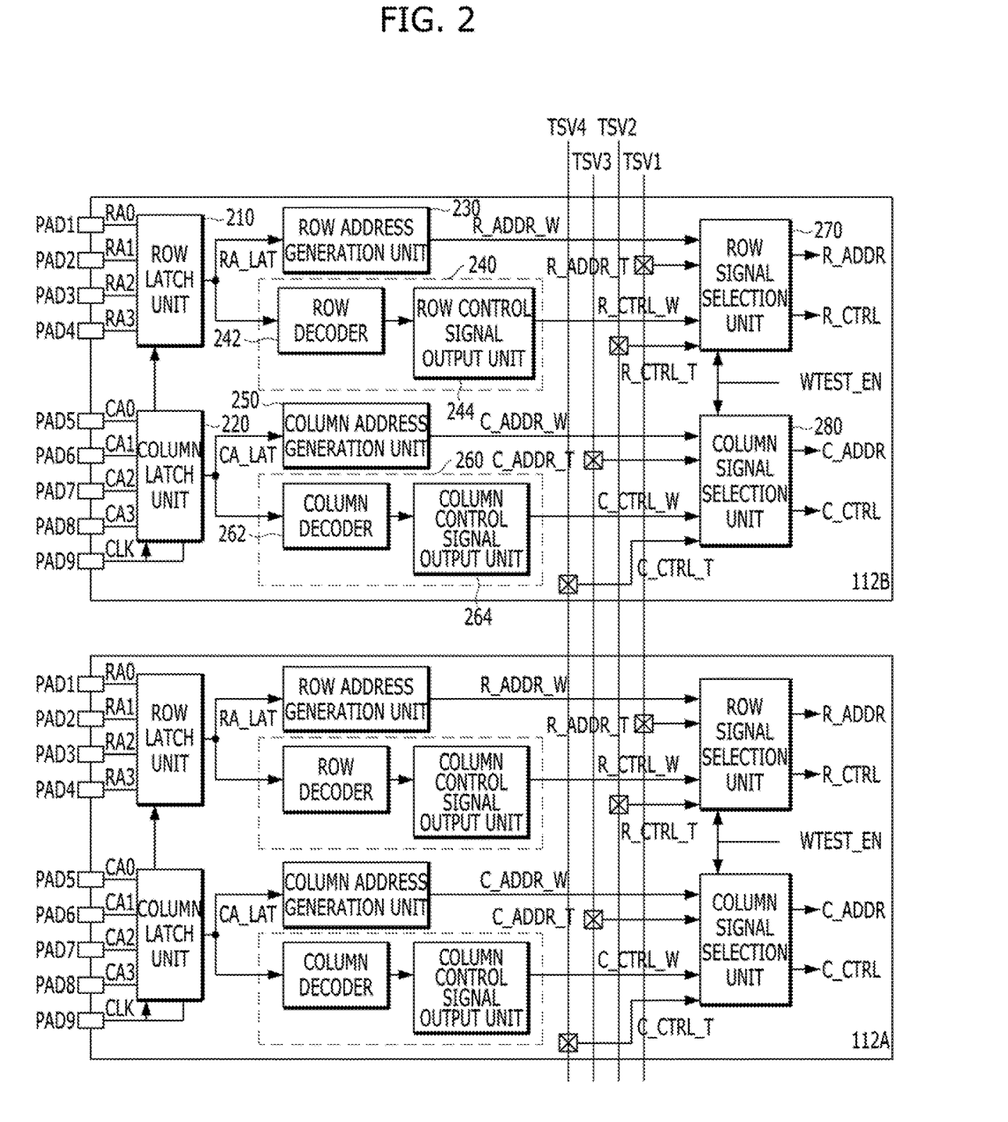
FIG. 2 is a diagram illustrating a configuration of stacked core dies shown in FIG. 1, according to an embodiment of the present invention.

Referring to FIG. 2, a configuration example of the stacked core dies 120A and 120B shown in FIG. 1 is provided. Even though a detailed configuration of the first and second core dies 112A and 112B is shown in FIG. 2 as an example, the remaining core dies 112C and 112D may have a configuration similar to the first and second core dies 112A and 112B.

Referring to FIG. 2, each of the core dies 112A and 112B may include a plurality of input pads PAD1 to PAD8, latch units 210 and 220, address generation units 230 and 250, control signal generation units 240 and 260, and signal selection units 270 and 280.

The input pads PAD1 to PAD8 may receive addresses RA0 to RA3 and CA0 to CA3 from an external device (e.g., a host) in a wafer-level test mode. The control signal generation units 240 and 260 may generate first control signals R_CTRL_W and C_CTRL_W by decoding the addresses RA0 to RA3 and CA0 to CA3 received through the input pads PAD1 to PAD8. The address generation units 230 and 250 may generate first addresses R_ADDR_W and C_ADDR_W by controlling timing of the addresses received through the input pads PAD1 to PAD8. The signal selection units 270 and 280 may select one of the first control signals R_CTRL_W and C_CTRL_W and second control signals R_CTRL_T and C_CTRL_T received from the base die 114 through TSVs (i.e., TSV2 and TSV4) to output the selected control signal as global control signals R_CTRL and C_CTRL, and select one of the first addresses R_ADDR_W and C_ADDR_W and second addresses R_ADDR_T and C_ADDR_T received from the base die 114 through TSVs (i.e., TSV1 and TSV3) to output the selected address as global addresses R_ADDR and C_ADDR.

Each of the core dies 112A and 112B may further include address latch units 210 and 220. The address latch units 210 and 220 may latch the addresses RA0 to RA3 and CA0 to CA3 received through the input pads PAD1 to PAD8, and provide the latched addresses to the control signal generation units 240 and 260 and the address generation units 230 and 250. In addition, each of the core dies 112A and 112B may further include an input pad PAD9 for receiving a clock signal CLK. The address latch units 210 and 220 may latch the addresses RA0 to RA3 and CA0 to CA3 in response to the clock signal CLK.

The addresses RA0 to RA3 and CA0 to CA3 may be classified into row addresses RA0 to RA3 and column addresses CA0 to CA3. The address latch units 210 and 220, the address generation units 230 and 250, the control signal generation units 240 and 260, and the signal selection units 270 and 280 may be classified into a row path and a column path.

More specifically, the address latch units 210 and 220 may include a row latch unit 210 for latching the row addresses RA0 to RA3 in response to the clock signal CLK to output a row latch address RA_LAT and a column latch unit 220 for latching the column addresses CA0 to CA3 in response to the clock signal CLK to output a column latch address CA_LAT.

The address generation unit 230 and 250 may include a row address generation unit 230 for generating a first row address R_ADDR_W by controlling timing of the row latch address RA_LAT and a column address generation unit 250 generating a first column address C_ADDR_W by controlling timing of the column latch address CA_LAT.

The control signal generation unit 240 and 260 may include a row control signal generation unit 240 for decoding the row latch address RA_LAT to output a first row control signal R_CTRL_W and a column control signal generation unit 260 for decoding the column latch address CA_LAT to output a first column control signal C_CTRL_W. The row control signal generation unit 240 may include a row decoder 242 for decoding the row latch address RA_LAT to generate a row command pulse signal for an internal operation of the corresponding core die and a row control signal output unit 244 for outputting the first row control signal R_CTRL_W in response to the row command pulse signal. The column control signal generation unit 260 may include a column decoder 262 for decoding the column latch address CA_LAT to generate a column command pulse signal for an internal operation of the corresponding core die and a column control signal output unit 264 outputting the first column control signal C_CTRL_W in response to the column command pulse signal. The row command pulse signal may include an active signal, a precharge signal, and a refresh signal. The column command pulse signal may include a read signal, a write signal, and a mode register set (MRS) signal. Furthermore, the first row control signal R_CTRL_W may include a bank active signal for defining a bank active time period. The first column control signal C_CTRL_W may include a column address strobe (CAS) signal and a test mode signal.

The signal selection unit 270 and 280 may include a row signal selection unit 270 and a column signal selection unit 280. The row signal selection unit 270 selects one of the first row control signal R_CTRL_W and the second row control signal R_CTRL_T received from the base die 114 through the TSV TSV2 to output the selected control signal as the global row control signal R_CTRL, and selects one of the first row address R_ADDR_W and the second row address R_ADDR_T received from the base die 114 through the TSV TSV1 to output the selected address as the global row address R_ADDR. The column signal selection unit 280 selects one of the first column control signal C_CTRL_W and the second column control signal C_CTRL_T received from the base die 114 through the TSV TSV4 to output the selected control signal as the global column control signal C_CTRL, and selects one of the first column address C_ADDR_W and the second column address C_ADDR_T received from the base die 114 through the TSV TSV3 to output the selected address as the global column address C_ADDR. The row signal selection unit 270 may select the first row control signal R_CTRL_W and the first row address R_ADDR_W in response to a wafer-level test enable signal WTEST_EN. The column signal selection unit 280 may select the first column control signal C_CTRL_W and the first column address C_ADDR_W in response to the wafer-level test enable signal WTEST_EN.

Figure 3:
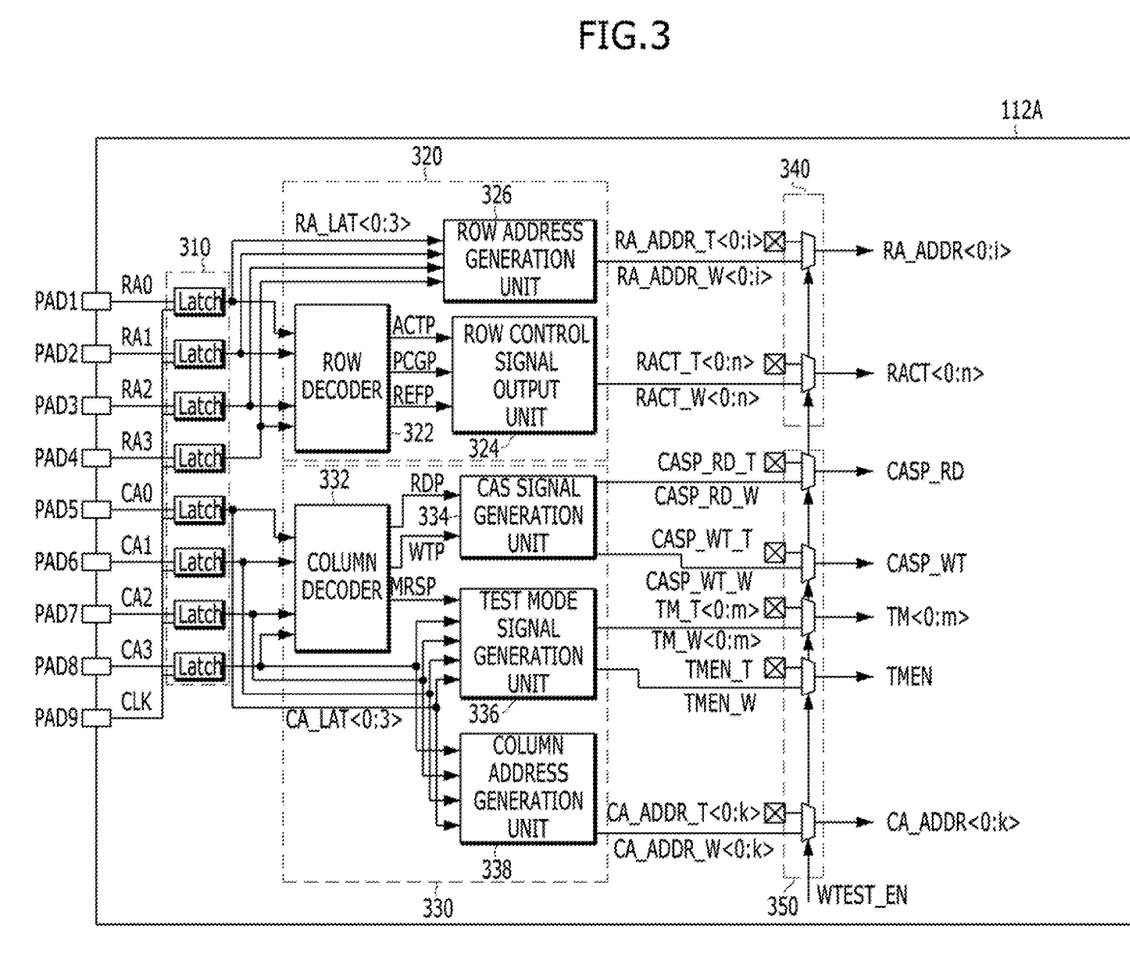
FIG. 3 is a detailed diagram of a core die shown in FIG. 1, according to an embodiment of the present invention.

FIG. 3 is a detailed block diagram of the first core die 112A shown in FIG. 1. Even though a detailed configuration of the first core die 112A is shown in FIG. 3 as an example, the remaining core dies 112B to 112D may have a configuration similar to the first core die 112A.

Referring to FIG. 3, the first core dies 112A may include a plurality of input pads PAD1 to PAD8, an address latch unit 310, a row signal generation unit 320, a column signal generation unit 330, a row signal selection unit 340, and a column signal selection unit 350.

The input pads PAD1 to PAD8 receive row addresses RA0 to RA3 and column addresses CA0 to CA3 from an external device in a wafer-level test mode. The address latch unit 310 latches the row addresses RA0 to RA3 and the column addresses CA0 to CA3 to output row latch addresses RA_LAT<0:3> and column latch addresses CA_LAT<0:3>. The row signal generation unit 320 decodes the row latch addresses RA_LAT<0:3> to generate a plurality of first row control signals RACT_W<0:n>, and controls timing of the row latch addresses RA_LAT<0:3> to generate first row addresses RA_ADDR_W<0:i>. The column signal generation unit 330 decodes the column latch addresses CA_LAT<0:3> to generate a plurality of first column control signals CASP_RD_W, CASP_WT_W, TM_W<0:m>, and TMEN_W, and controls timing of the column latch addresses CA_LAT<0:3> to generate first column addresses CA_ADDR_W<0:k>. The row signal selection unit 340 selects one of the first row control signals RACT_W<0:n> and the second row control signals RACT_T<0:n> received from the base die 114 through the TSVs in response to the wafer-level test enable signal WTEST_EN to output the selected control signals as the global row control signals RACT<0:n>, and selects one of the first row addresses RA_ADDR_W<0:i> and second row addresses RA_ADDR_T<0:i> received from the base die 114 through the TSVs in response to the wafer-level test enable signal WTEST_EN to output the selected addresses as global row addresses RA_ADDR<0:i>. The column signal selection unit 350 selects one of the first column control signals CASP_RD_W, CASP_WT_W, TM_W<0:m>, and TMEN_W and second column control signals CASP_RD_T, CASP_WT_T, TM_T<0:m>, and TMEN_T received from the base die 114 through the TSVs in response to the wafer-level test enable signal WTEST_EN to output the selected control signals as global column control signals CASP_RD, CASP_WT, TM<0:m>, and TMEN, and selects one of the first column addresses CA_ADDR_W<0:k> and second column addresses CA_ADDR_T<0:k> received from the base die 114 through the TSVs in response to the wafer-level test enable signal WTEST_EN to output the selected addresses as global column addresses CA_ADDR<0:k>.

More specifically, the row signal generation unit 320 may include a row decoder 322, a row control signal output unit 324, and a row address generation unit 326. The row decoder 322 decodes the row latch addresses RA_LAT<0:3> to generate row command pulse signals ACTP, PCGP and REFP for an internal operation of the corresponding core die. The row control signal output unit 324 outputs the first row control signals RACT_W<0:n> in response to the row command pulse signals ACTP, PCGP and REFP. The row address generation unit 326 controls timing of the row latch addresses RA_LAT<0:3> to generate the first row addresses RA_ADDR_W<0:i>. In this case, the row command pulse signals ACTP, PCGP and REFP may include an active signal ACTP, a precharge signal PCGP, and a refresh signal REFP. The row control signal output unit 324 may include a bank active signal generation unit for generating a plurality of bank active signals in response to the row command pulse signals ACTP, PCGP and REFP.

Furthermore, the column signal generation unit 330 may include a column decoder 332, a CAS signal generation unit (i.e., a column control signal generation unit) 334, a test mode signal generation unit 336, and a column address generation unit 338. The column decoder 332 decodes the column latch addresses CA_LAT<0:3> to generate column command pulse signals RDP, WTP and MRSP for an internal operation of the corresponding core die. The test mode signal generation unit 336 generates test mode signals TMEN and TM<0:m> in response to an MRS signal MRSP and the column latch addresses CA_LAT<0:3>. The CAS signal generation unit 334 generates a CAS signal CASP_RD and CASP_WT in response to a read signal RDP and a write signal WTP.

The core dies 112A may further include an input pad PAD9 for receiving the clock signal CLK. The address latch unit 310 may latch the row addresses RA0 to RA3 and the column addresses CA0 to CA3 received through the input pads PAD1 to PAD8 in synchronization with the clock signal CLK, and output the latched addresses as the row latch addresses RA_LAT<0:3> and the column latch addresses CA_LAT<0:3>.

Each of the row signal selection unit 340 and the column signal selection unit 350 may include a plurality of multiplexers for selecting an input signal in response to the wafer-level test enable signal WTEST_EN enabled when a wafer-level test is performed. That is, when a wafer-level test is performed, the row signal selection unit 340 and the column signal selection unit 350 selects signals generated within the corresponding core die 112A, for example, the first row control signals RACT_W<0: n>, the first row addresses RA_ADDR_W<0:i>, the first column control signals CASP_RD_W, CASP_WT_W, TM_W<0:m>, and TMEN_W, and the first column addresses CA_ADDR_W<0:k>. In contrast, when a package-level test other than a wafer-level is performed (i.e., the wafer-level test enable signal WTEST_EN is deactivated), the row signal selection unit 340 and the column signal selection unit 350 selects signals received from the base die 114 through the TSVs, for example, the second row control signals RACT_T<0:n>, the second row addresses RA_ADDR_T<0:i>, the second column control signals CASP_RD_T, CASP_WT_T, TM_T<0:m>, and TMEN_T, and the second column addresses CA_ADDR_T<0:k>.

Even though each of the row address and column address has been illustrated as being four bits, the present invention is not limited in this way. It is noted that each of the row address and column address may have more or fewer bits. Preferably, each of the row address and column address may be set as a minimum number of bits to be inputted for a wafer-level test.

As described above, in the stacked memory device according to an embodiment of the present invention, if most of address/command control circuits are disposed in the base die 114, each of the core dies 112A to 112D generates signals equivalent to the global control signals generated by the base die 114, and one of the global control signals received from the base die 114 or one of the signals generated by each core die is selected based on whether a package-level test or wafer-level test is performed. Accordingly, a wafer-level test in addition to a package-level test in the core dies may be performed.

Meanwhile, in a stacked memory device in which global control signals are provided from a base die to a core die through TSVs, only an address for a wafer-level test is inputted. In contrast, in a stacked memory device in which row addresses and column addresses are provided from a base die to a core die using TSVs, all addresses for a memory core operation need to be inputted. In this case, since addresses for a wafer-level test has a smaller number of bits than addresses for the memory core operation, the number of input pads for receiving the addresses may be decreased when compared to the actual number of input pads for receiving the addresses for the memory core operation. Accordingly, a stacked memory device occupying a small area may be provided and a wafer-level test may be performed on respective core dies included therein.

As the structure of a memory device becomes complicated, there is a need for various types of test modes in which the complicated memory device is tested. For example, the number of signals for testing a stacked memory device, such as a test mode enable signal TMEN, test mode signals TM<0:m>, test group signals, a test group setting signal, and a test group resetting signal, may be gradually increased in various ways. If all the various types of signals are transferred from a base die to each of core dies through TSVs, the number of TSVs will have to be increased. Accordingly, there is proposed a method of disposing only a test mode generation circuit among a control signal generation block in the respective core dies and transferring an MRS signal and a column latch address needed for the test mode generation circuit from the base die to each of the respective core dies through the TSVs.

A stacked semiconductor device for supporting a wafer-level test is described below, wherein most of address/command control circuits are disposed in a base die and the test mode generation circuit is disposed in a core die.

Figure 4:
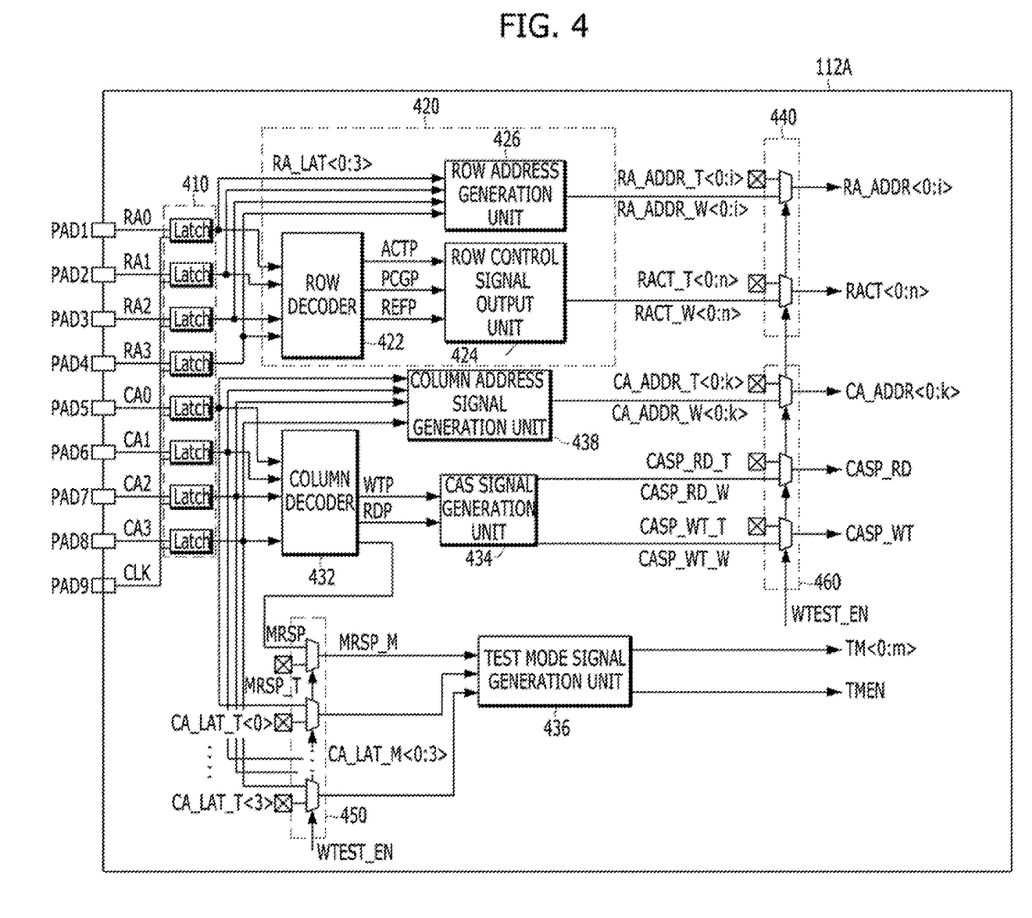
FIG. 4 is a detailed diagram of a core die shown in FIG. 1, according to another embodiment of the present invention.

FIG. 4 is another example of a detailed configuration of the first core die 112A shown in FIG. 1. Even though a detailed configuration of the first core die 112A is shown in FIG. 4 as an example, the remaining core dies 112B to 112D may have a configuration similar to the first core die 112A.

Referring to FIG. 4, the first core dies 112A may include a plurality of input pads PAD to PAD8, an address latch unit 410, a row signal generation unit 420, a row signal selection unit 440, a column decoder 432, a first column signal selection unit 450, a test mode signal generation unit 436, a CAS signal generation unit (e.g., a column control signal generation unit) 434, a column address generation unit 438, and a second column signal selection unit 460.

The input pads PAD1 to PAD8 receive row addresses RA0 to RA3 and column addresses CA0 to CA3 from an external device in a wafer-level test mode. The address latch unit 410 latches the row addresses RA0 to RA3 and the column addresses CA0 to CA3 received through the input pads PAD1 to PAD8 to output row latch addresses RA_LAT<0:3> and column latch addresses CA_LAT<0:3>. The row signal generation unit 420 decodes the row latch addresses RA_LAT<0:3> to generate first row control signals RACT_W<0:n>, and controls timing of the row latch addresses RA_LAT<0:3> to generate first row addresses RA_ADDR_W<0:i>. The row signal selection unit 440 selects one of the first row control signals RACT_W<0:n> and second row control signals RACT_T<0:n> received from the base die 114 through TSVs in response to a wafer-level test enable signal WTEST_EN to output the selected control signals as global row control signals RACT<0:n>, and selects one of the first row addresses RA_ADDR_W<0:i> and second row addresses RA_ADDR_T<0:i> received from the base die 114 through corresponding TSVs in response to the wafer-level test enable signal WTEST_EN to output the selected addresses as global row addresses RA_ADDR<0:i>. The column decoder 432 decodes the column latch addresses CA_LAT<0:3> to generate a first column command pulse signal MRSP and second column command pulse signals RDP and WTP for an internal operation of the corresponding core die 112A by. The first column signal selection unit 450 selects one of the first column command pulse signal MRSP and an MRS pulse signal MRSP_T received from the base die 114 through a corresponding TSV in response to the wafer-level test enable signal WTEST_EN to output the selected pulse signal as a source command pulse signal MRSP_M, and selects one of the column latch addresses CA_LAT<0:3> and addresses CA_LAT_T<0:3> received from the base die 114 through corresponding TSVs to output the selected addresses as source column addresses CA_LAT_M<0:3>. The test mode signal generation unit 436 generates a plurality of test mode signals TMEN and TM<0:m> in response to the source column command pulse signal MRSP_M and the source column addresses CA_LAT_M<0:3>. The CAS signal generation unit 434 generates first column control signals CASP_RD_W and CASP_WT_W based on the second column command pulse signals RDP and WTP. The column address generation unit 438 controls timing of the column latch addresses CA_LAT<0:3> to generate first column addresses CA_ADDR_W<0:k>. The second column signal selection unit 460 selects one of the first column control signals CASP_RD_W and CASP_WT_W and second column control signals CASP_RD_T and CASP_WT_T received from the base die 114 through corresponding TSVs in response to the wafer-level test enable signal WTEST_EN to output the selected control signal as global column control signals CASP_RD and CASP_WT, and selects one of the first column addresses CA_ADDR_W<0:k> and second column addresses CA_ADDR_T<0:k> received from the base die 114 through corresponding TSVs to output the selected addresses as global column addresses CA_ADDR<0:k>.

The row signal generation unit 420 may include a row decoder 422, a row control signal output unit 424, and a row address generation unit 426. The row signal generation unit 420 of FIG. 4 may have a configuration substantially the same as the row signal generation unit 320 of FIG. 3, and thus a detailed description thereof is omitted.

The CAS signal generation unit 434 may generate CAS signals (e.g., the first column control signals CASP_RD_W and CASP_WT_W) based on the second column command pulse signal RDP and WTP.

Accordingly, in a case where most of address/command control circuits are disposed in the base die 114 and the test mode generation circuit (e.g., the test mode generation unit 436) is disposed in the corresponding core die 112A as described above, in a package-level, the MRS pulse signal MRSP_T and the column latch addresses CA_LAT<0:3> for the test mode generation circuit may be transferred from the base die 114 to the respective core dies 112A to 112D through TSVs. In a wafer-level, the test mode signals TMEN and TM<0:m> for a wafer-level test are generated using the MRS pulse signal MRSP_T and the column latch addresses CA_LAT<0:3> which are internally generated. Accordingly, an area may be efficiently used because the number of TSVs does not need to be increased and the test mode generation circuit does not need to be redundantly disposed in the base die 114.

As described above, in the stacked memory device according to the embodiment of the present invention, if most of address/command control circuits are disposed in the base die 114, each of the core dies 112A to 112D generates signals equivalent to the global control signals generated by the base die 114, and either one of the global control signals received from the base die 114 or one of the signals generated by each core die is selected based on whether a package-level test or a wafer-level test is performed. Accordingly, a wafer-level test in addition to a package-level test in the core dies mat may be performed.

Although various embodiments have been described for illustrative purposes, it will be apparent to those skilled in the art that various changes and modifications may be made without departing from the spirit and or scope of the invention as defined in the following claims.

What is claimed is:

1. A stacked memory device comprising:
 a base die and a plurality of core dies stacked using a plurality of through-chip electrodes,
 wherein each of the core dies comprises:
 a plurality of input pads capable of receiving addresses externally in a wafer-level test mode;
 a control signal generation unit capable of decoding the addresses received through the input pads to generate a first control signal;
 an address generation unit capable of generating a first address based on the addresses received through the input pads; and
 a signal selection unit capable of selecting one of the first control signal and a second control signal received from the base die through a corresponding through-chip electrode to output a global control signal, and selecting one of the first address and a second address received from the base die through a corresponding through-chip electrode to output a global address.

2. The stacked memory device of claim 1, wherein the signal selection unit selects the first control signal and the first address in the wafer-level test mode.

3. The stacked memory device of claim 2, further comprising:
 an address latch unit capable of latching the addresses received through the input pads to provide the latched addresses to the control signal generation unit and the address generation unit.

4. The stacked memory device of claim 2, wherein the control signal generation unit comprises:
 a decoder capable of decoding the addresses received through the input pads to generate a command pulse signal for an internal operation of a corresponding core die; and
 a control signal output unit capable outputting the first control signal based on the command pulse signal.

5. The stacked memory device of claim 4, wherein the command pulse signal comprises an active signal, a precharge signal, a refresh signal, a read signal, a write signal, and a mode register set (MRS) signal.

6. The stacked memory device of claim 4, wherein the first control signal comprises a bank active signal, a column address strobe (CAS) signal, and a test mode signal.

7. A stacked memory device comprising:
 a base die and a plurality of core dies stacked using a plurality of through-chip electrodes,
 wherein each of the core dies comprises:
 a plurality of input pads capable of receiving column addresses and row addresses externally in a wafer-level test mode;
 an address latch unit capable of latching the row addresses and column addresses received through the input pads to output a row latch address and a column latch address;
 a row signal generation unit capable of decoding the row latch address to generate first row control signals, and generating a first row address based on the row latch address;
 a column signal generation unit capable of decoding the column latch address to generate first column control signals, and generating a first column address based on the column latch address;
 a row signal selection unit capable of selecting one of the first row control signal and a second row control signal received from the base die through a corresponding through-chip electrode based on a wafer-level test enable signal to output a global row control signal, and selecting one of the first row address and a second row address received from the base die through a corresponding through-chip electrode based on the wafer-level test enable signal to output a global row address; and a column signal selection unit capable of selecting one of the first column control signal and a second column control signal received from the base die through a corresponding through-chip electrode based on the wafer-level test enable signal to output a global column control signal, and selecting one of the first column address and a second column address received from the base die through a corresponding through-chip electrode based on the wafer-level test enable signal to output a global column address.

8. The stacked memory device of claim 7, wherein, in the wafer-level test mode,
the row signal selection unit selects the first row control signal and the first row address, and
the column signal selection unit selects the first column control signal and the first column address.

9. The stacked memory device of claim 8, wherein the row signal generation unit comprises:
a row decoder capable of decoding the row latch address to generate a row command pulse signal for an internal operation of a corresponding core die;
a row control signal output unit capable of outputting the first row control signal based on the row command pulse signal; and
a row address generation unit capable of generating the first row address based on the row latch address.

10. The stacked memory device of claim 9, wherein the row command pulse signal comprises an active signal, a precharge signal, and a refresh signal.

11. The stacked memory device of claim 9, wherein the row control signal output unit generates a plurality of bank active signals in response to the row command pulse signal.

12. The stacked memory device of claim 8, wherein the column signal generation unit comprises:
a column decoder capable of decoding the column latch address to generate a column command pulse signal for an internal operation of a corresponding core die;
a column control signal output unit capable of outputting the first column control signal based on the column command pulse signal and the column latch address; and
a column address generation unit capable of generating the first column address based on the column latch address.

13. The stacked memory device of claim 12, wherein the column control signal output unit comprises:
a test mode signal generation unit capable of generating a test mode signal based on a first column command pulse signal and the column latch address; and a CAS signal generation unit capable of generating a CAS signal based on a second column command pulse signal.

14. The stacked memory device of claim 13, wherein:
the first column command pulse signal comprises a mode register set (MRS) signal, and
the second column command pulse signal comprises a read signal and a write signal.

15. The stacked memory device of claim 8, wherein:
each of the core dies further comprises a clock input pad capable of receiving a clock signal, and
the address latch unit latches the column addresses and row addresses received through the input pads in synchronization with the clock signal to output the row latch address and the column latch address.

16. A stacked memory device comprising:
a base die and a plurality of core dies stacked using a plurality of through-chip electrodes,
wherein each of the core dies comprises:
a plurality of input pads capable of receiving addresses externally in a wafer-level test mode;
an address latch unit capable of latching the addresses received through the input pads to output latch addresses;
a decoder capable of decoding the latch addresses to generate a first command pulse signal;
a first signal selection unit capable of selecting one of the first command pulse signal and a second command pulse signal received from the base die through a corresponding through-chip electrode based on a wafer-level test enable signal to output a source command pulse signal, and selecting one of the latch addresses and addresses received from the base die through corresponding through-chip electrodes based on the wafer-level test enable signal to output a source address; and
a test mode signal generation unit capable of generating a plurality of test mode signals based on the source command pulse signal and the source address.

17. The stacked memory device of claim 16, wherein the first signal selection unit selects the first command pulse signal and the latch addresses in the wafer-level test mode.

18. The stacked memory device of claim 17, wherein the command pulse signal comprises a mode register set (MRS) signal.

19. The stacked memory device of claim 17, further comprising:
an address generation unit capable of generating a first address based on the latch addresses; and
a second signal selection unit capable of selecting one of the first address and a second address received from the base die through a corresponding through-chip electrode to output a global address.

* * * * *